(12) United States Patent
Child et al.

(10) Patent No.: US 7,924,033 B2
(45) Date of Patent: Apr. 12, 2011

(54) COMPENSATION TOOL FOR CALIBRATING AN ELECTRONIC COMPONENT TESTING MACHINE TO A STANDARDIZED VALUE

(75) Inventors: Scott L. Child, Beaverton, OR (US); Nick A. Tubbs, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 476 days.

(21) Appl. No.: 12/052,883

(22) Filed: Mar. 21, 2008

(65) Prior Publication Data
US 2009/0237096 A1 Sep. 24, 2009

(51) Int. Cl.
G01R 31/00 (2006.01)
G01R 31/26 (2006.01)
G01R 31/20 (2006.01)

(52) U.S. Cl. ......... 324/750.02; 324/750.16; 324/750.19; 324/756.01; 324/757.01

(58) Field of Classification Search .................. None
See application file for complete search history.

(56) References Cited

U.S. PATENT DOCUMENTS

| 5,406,200 | A | * | 4/1995 | Begin et al. .............. 324/207.12 |
| 5,568,870 | A | | 10/1996 | Utech |
| 5,842,579 | A | | 12/1998 | Garcia et al. |
| 6,194,679 | B1 | | 2/2001 | Garcia et al. |
| 6,507,185 | B1 | | 1/2003 | Hennekes et al. |
| 6,906,508 | B1 | | 6/2005 | Saulnier et al. |
| 7,173,432 | B2 | | 2/2007 | Garcia et al. |
| 2003/0102857 | A1 | | 6/2003 | Hirschmann |
| 2006/0232279 | A1 | | 10/2006 | Garcia et al. |

\* cited by examiner

*Primary Examiner* — Roberto Velez
(74) *Attorney, Agent, or Firm* — Young Basile

(57) ABSTRACT

A compensation tool and process is provided for calibrating each test position located at a plurality of test modules of an electronic testing machine to a standardized value. Each test module is located on an angularly spaced radial line extending from an associated central axis and has a plurality of contacts for testing electronic components. The compensation tool can include a body having an axis of rotation coaxially alignable with the central axis for rotation to different angular positions and a component-support member operably associated with the body for indexing movement to selectively align a pocket with different contacts associated with each test position located at each of the plurality of test modules. The pocket of the component-support member receives an electronic component with terminated ends extending outwardly to allow electrical contact and testing of each test position located at each the plurality of test modules.

20 Claims, 7 Drawing Sheets

COMPENSATION TOOL FOR CALIBRATING AN ELECTRONIC COMPONENT TESTING MACHINE TO A STANDARDIZED VALUE

FIELD OF THE INVENTION

The present invention relates to an apparatus and method for calibrating an electronic testing machine including at least one test module having a plurality of contacts for testing electronic components, such as multilayer ceramic capacitors (MLCC), to a standardized value.

BACKGROUND

It is generally known to provide a multilayer ceramic capacitor (MLCC) of a known value that can be manually placed in a particular test pocket of a test plate and electrically tested at a single contact station. The capacitor then cycles through the other test stations, is blown off of the test plate, recovered, and placed in position for the next test station. This is repeated until the capacitor's value has been recorded for each test station. This current process for standard compensation causes some mechanical abrasion to the terminated ends of the MLCC as the part is moved across multiple contacts, blown off the test plate, recovered, and the process repeated. When the MLCC is tested in the final station, it may have different electrical properties than it did when it was tested in the first station due to mechanical damage.

It would be desirable to provide a method to test a single component, such as a multilayer ceramic capacitor (MLCC), through multiple test stations on a tester without causing undue damage to the terminated ends of the capacitor and without risk of losing the capacitor. This procedure would be desirable to calibrate machine parameters to a particular value that can then be used as a standard value.

SUMMARY

As described herein, an electronic testing machine includes a plurality of test modules. Each test module is located on angularly spaced radial lines extending from an associated central axis and has a plurality of contacts for testing electronic components. One compensation tool for calibrating the plurality of test modules of the electronic testing machine to a standardized value can include a body having an axis of rotation coaxially alignable with the central axis associated with the plurality of test modules for rotation about the axis of rotation to different angular positions, and a component-support member operably associated with the body for indexing movement to selectively align with contacts associated with each test position located at each of the plurality of test modules. The component-support member can include a pocket for receiving an electronic component with terminated ends extending outwardly to allow electrical contact and testing of each test position located at each of the plurality of test modules.

A process or method is also taught herein for calibrating a plurality of test modules in an electronic testing machine to a standardized value with a compensation tool. Each test module is located on angularly spaced radial lines extending from an associated central axis and has a plurality of contacts for testing electronic components. The process can include engaging a body having an axis of rotation coaxially alignable with the central axis associated with the plurality of test modules for rotation about the axis of rotation to different angular positions. The process can also include indexing a component-support member with respect to the body to selectively align with contacts associated with each test position located at each of the plurality of test modules. The component-support member can include at least one pocket for receiving an electronic component with terminated ends extending outwardly to allow electrical contact and testing of each test position located at each the plurality of test modules.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 6A:
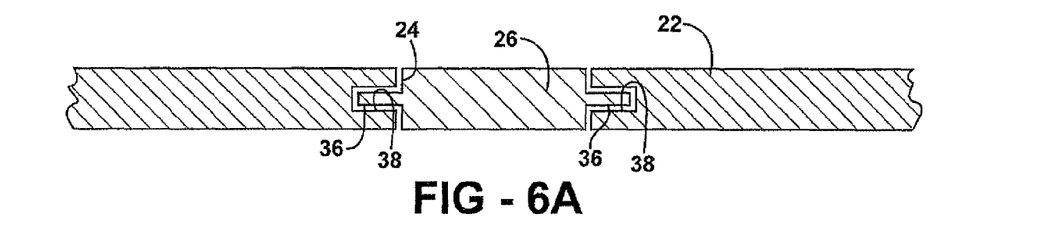
FIG. 6A is a cross sectional view of the component-support member taken along line 6A-6A in FIG. 3.
Figure 6B:
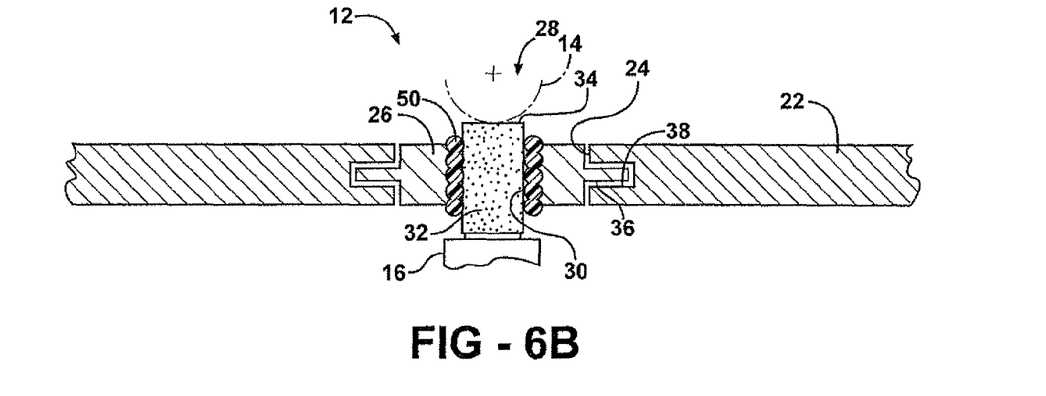
FIG. 6B is a cross sectional view of the component-support member taken along line 6B-6B in FIG. 3.
Figure 6C:
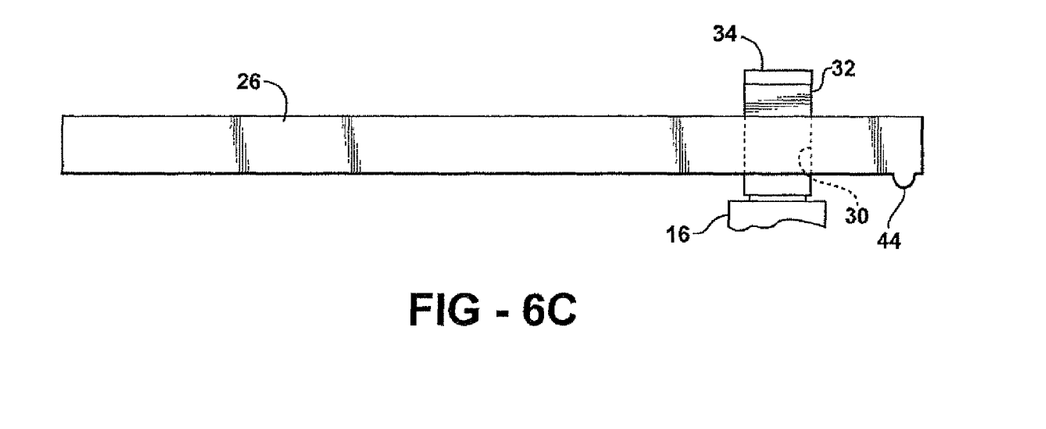
FIG. 6C is a cross sectional view of the component-support member taken along line 6C-6C in FIG. 3.
Figure 7:
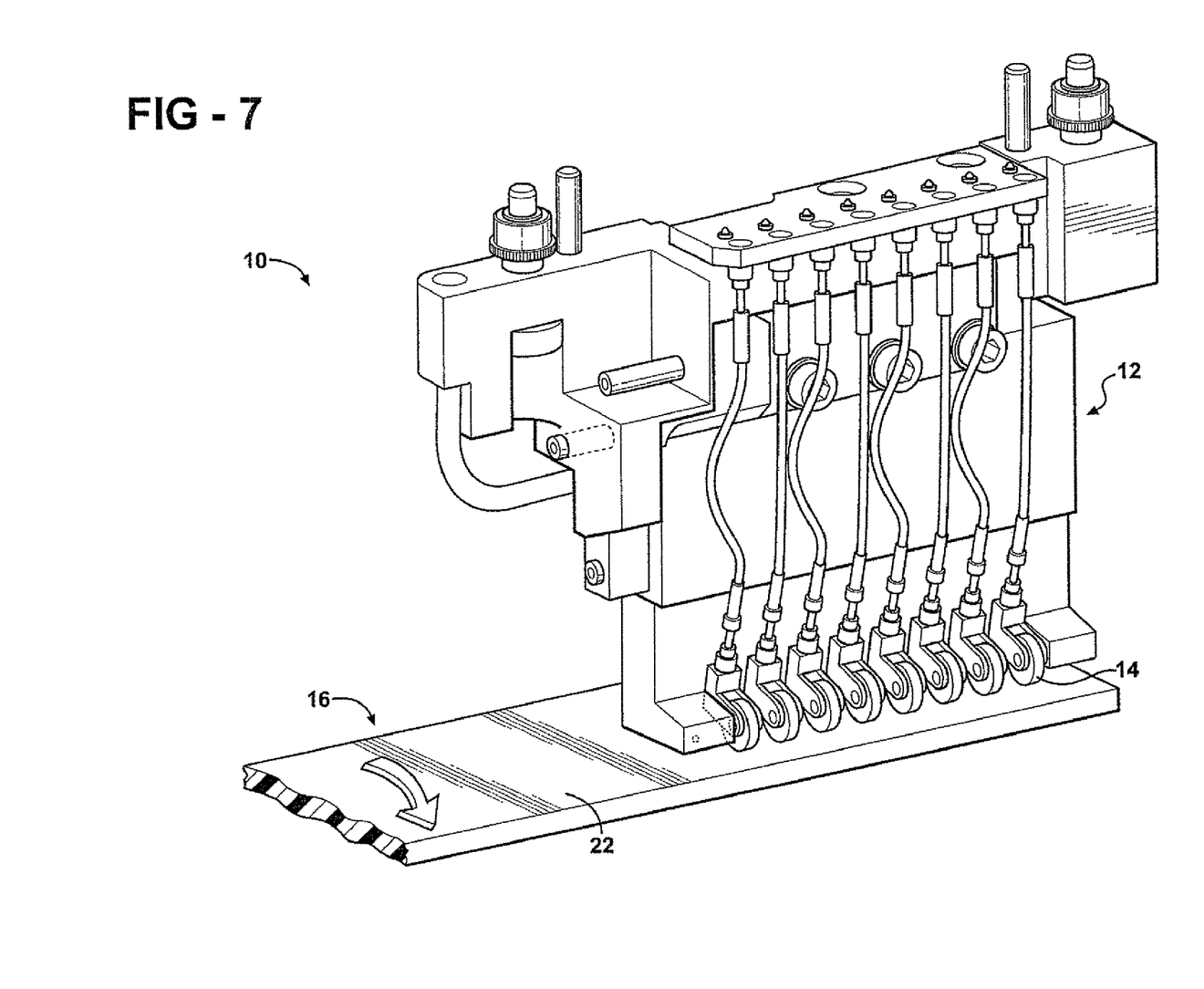
FIG. 7 is a simplified perspective view of an electronic testing machine having at least one test module located on a radial line extending from a central axis and a plurality of contacts for testing an electronic component.

Referring briefly to FIGS. 6B, 6C and 7, an electronic testing machine 10 has at least one upper contact 14 and at least one lower contact 15 of a test module 12. Each test module 12 can be located on angularly spaced radial lines extending from an associated central axis and has a plurality of opposing contact pairs 14, 15 for testing electronic components. A production test plate or disk 20 can include a plurality of pockets. Each pocket carries an electronic component 32 to a test position 28 to be electrically inserted between upper and lower contacts 14, 15 of test module 12 in order to perform one or more tests on the electronic component 32. The test plate 20 is rotatable about its central axis to transfer an electronic component 32 to and from a test position 28 associated with corresponding upper and lower contacts 14, 15 of different test modules 12.

Figure 8:
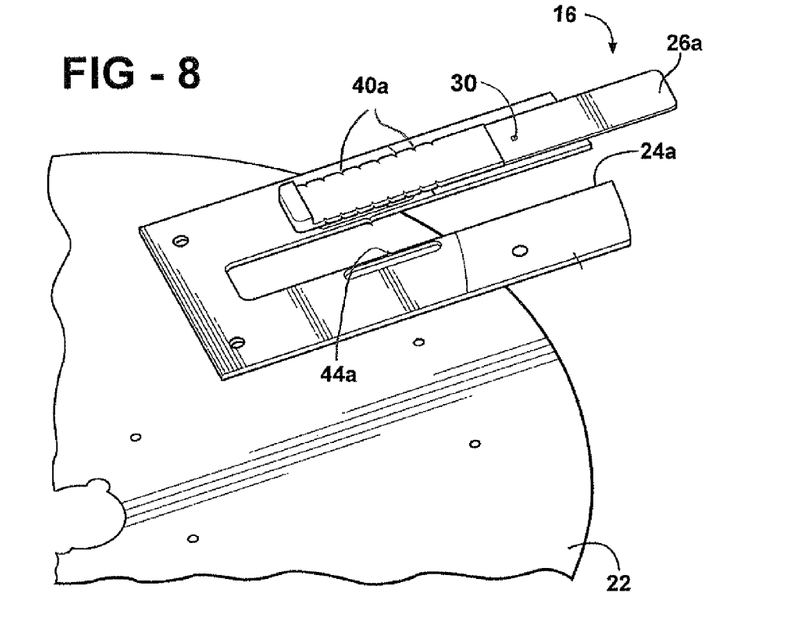
FIG. 8 is a simplified exploded perspective view of a body having an axis of rotation coaxially aligned with a central axis associated with the plurality of test modules for rotation about the axis of rotation to different angular positions and a radially movable component-support member for indexing movement to selectively align with different contacts associated with each test position located at each of the plurality of test modules of an electronic testing machine.
Figure 9:
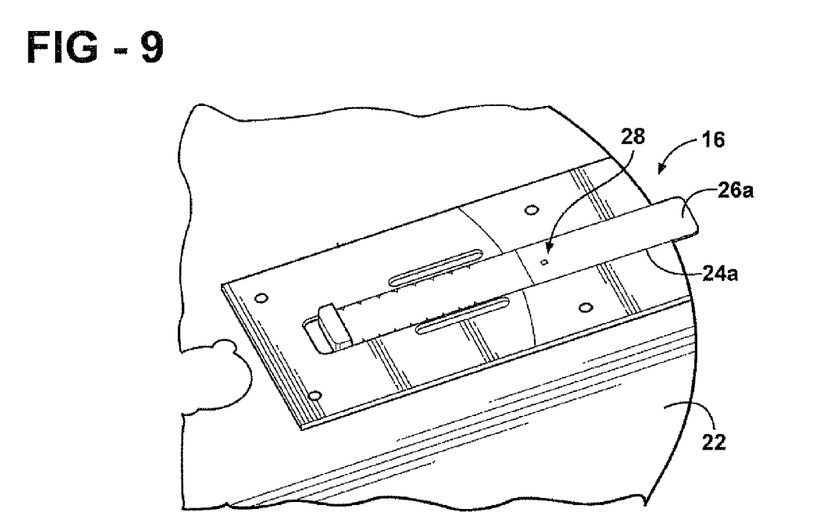
FIG. 9 is an assembled detailed perspective view of the body having an axis of rotation coaxially aligned with the central axis associated with the plurality of test modules for rotation about the axis of rotation to different angular positions, and the component-support member for indexing movement to selectively align with contacts associated with each test position located at each of the plurality of test modules of an electronic testing machine illustrated in FIG. 8.

Referring now to FIGS. 1-4B and 7, a compensation tool 16 for calibrating the plurality of test modules 12 of the electronic testing machine 10 to a standardized value includes a body 22 having an axis of rotation coaxially alignable with the central axis associated with the plurality of test modules 12 for rotation about the axis of rotation to different angular positions. The central axis can be defined by a center shaft 18 of the test plate 20. By way of example and not limitation, the body 22 includes a slot 24 associated therewith as illustrated in FIGS. 1-6C or a slot 24a associated therewith as shown in FIGS. 8 and 9. A component-support member 26, is, by way of example and not limitation, a slide such as that illustrated in FIGS. 1-6C or 8-9, which is engageable within the slot 24 associated with the body 22 for indexing movement to selectively align with different contacts 14 associated with each test position 28 located at each of the plurality of test modules 12. The component-support member 26 includes a pocket 30 for receiving an electronic component 32 with terminated ends 34 extending outwardly to allow electrical contact and testing of each test position 28 located at each of the plurality test modules 12.

A single electronic component 32 is alignable angularly and radially with contacts 14, 15 associated with each test position 28 for each of the plurality of test modules 12 to be tested. A reading of a value for the single electronic component 32 is recorded for each test position 28 located at each of the plurality of test modules 12. Each test position 28 is calibrated based on the recorded value read for the single electronic component 32.

Figure 5:
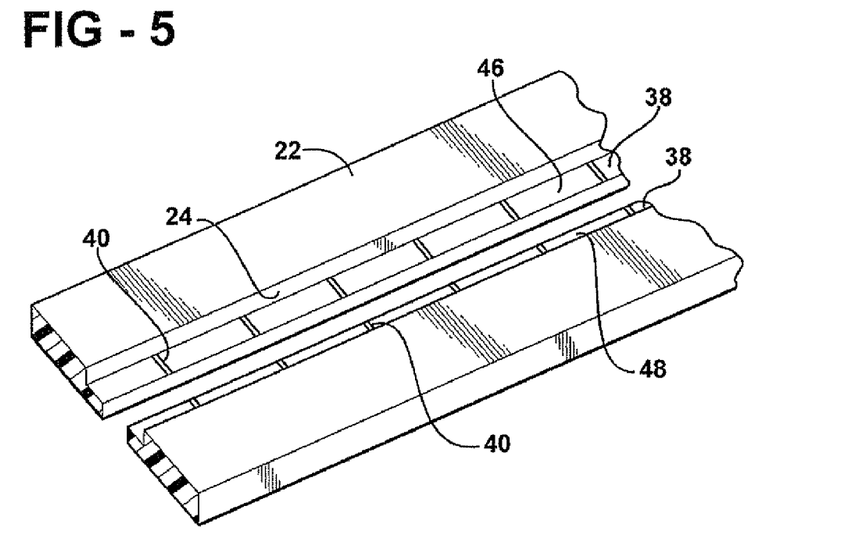
FIG. 5 is an enlarged detailed view of the body of FIGS. 1 and 2 illustrating track index detents for engaging a corresponding ridge or stop of the component-support member for holding the component-support member in one of the plurality of indexed test positions.

As shown in FIGS. 3, 5, 6A and 6B, the body 22 and component-support member 26 define opposing complementary interface surfaces 38, 36 that allow indexing movement of the component-support member 26 relative to the body 22. By way of example and not limitation, as best seen in FIG. 5, a plurality of track index detents 40 are located along a surface of the slot 24 between the opposing interface surfaces 38, 36 of the body 22 and the component-support member 26. At least one stop 44 (see FIG. 6C) interacts with the at least one detent 40 corresponding to each radially spaced test position 28 for the electronic component 32. It should be recognized that the detent 40 and stop 44 can be located on either of the opposing surfaces of the slot 24 and component-support member 26. By way of example and not limitation, the plurality of detents 40 can be located on opposite sides 46, 48 of the slot 24 for engagement with at least one stop 44 associated with the component-support member 26. A compliant material 50 can be positioned in the pocket 30 for receiving the electronic component 32 as seen in FIG. 6B.

Figure 10A:
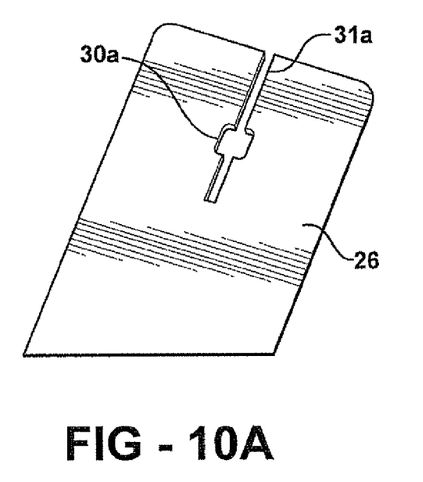
FIGS. 10A and 10B are simplified perspective views of possible alternative pockets carried by the component-support member.
Figure 10B:
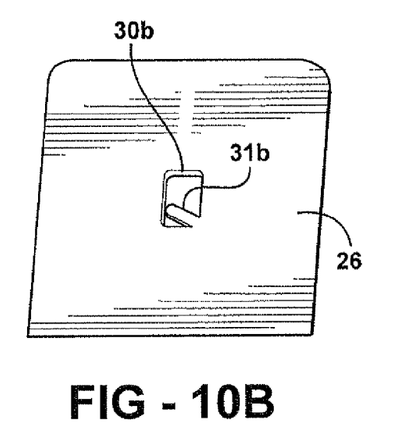
Figure 11:
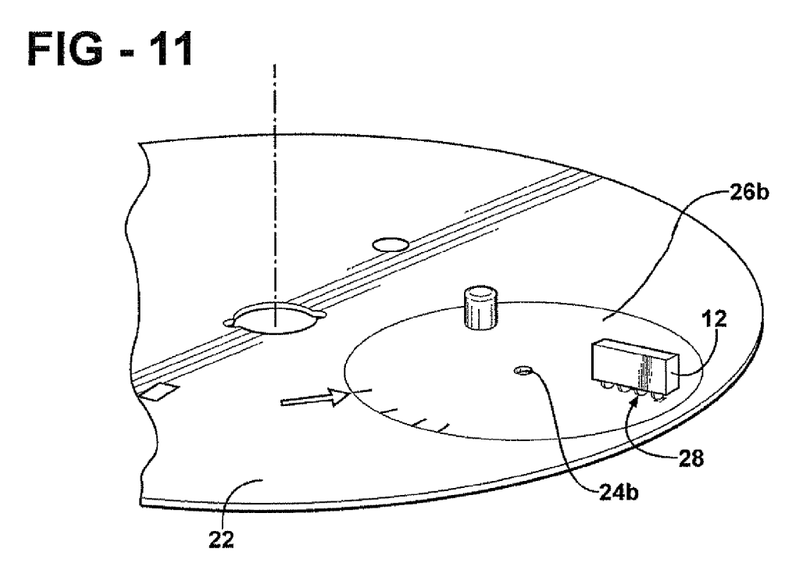
FIG. 11 is a simplified perspective view of a body having an axis of rotation coaxially aligned with a central axis associated with the plurality of test modules for rotation about the axis of rotation to different angular positions and an angularly rotatable component-support member for indexing movement to selectively align with different contacts associated with each test position located at each of the plurality of test modules of an electronic testing machine.

By way of example and not limitation, the component-support member 26 includes a slide 26a engageable within a slot 24a associated with the body 22 for radial indexing movement between test positions 28, as illustrated in FIGS. 1-6C or 8-9, or includes a disk 26b rotatable about an axis of rotation 24b associated with the body 22 for rotational indexing movement between different test positions 28, where the axis of rotation 24b is offset from the central axis of the body 22 as illustrated in FIG. 11. The slide 26a and slot 24a can be defined as separate components assembled to the body 22 in any suitable fashion, such as by a mechanical fastener, a chemical adhesive, a material bond, or any combination thereof. By way of example and not limitation, the pocket 30 for receiving the electronic component 32 can be as illustrated in FIGS. 1-4B, 6A, 6B, 8, 9 or 11, or can be as illustrated in FIG. 10A or 10B. The pocket 30a illustrated in FIG. 10A is split into two portions with a slot 31a for providing a pressure fit between the electronic component 32 and the pocket 30a. As illustrated in FIG. 10B, the pocket 30b includes a finger 31b extending inwardly for providing a pressure fit between the electronic component 32 and the pocket 30b. As mentioned above, a conformable material 50, as best seen in FIG. 6B, can be positioned in any of the pockets 30, 30a, 30b for receiving the electronic component 32.

A process or method for calibrating a plurality of test modules 12 in an electronic testing machine 10 to a standardized value with a compensation tool 16 is also taught herein. Each test module 12 is located on an angularly spaced radial line extending from a central axis associated with the plurality of test modules 12 and has the plurality of contacts 14, 15 for testing electronic components as previously described. The process includes coaxially aligning a body 22 with the central axis of a center shaft 18 of a test plate 20 for rotation about the axis of rotation to different angular positions. The process includes indexing a component-support member 26 with respect to the body 22 to selectively align with contacts 14, 15 associated with each test position 28 located at each of the plurality of test modules 12. The component-support member 26 includes at least one pocket 30 for receiving an electronic component 32 with terminated ends 34 extending outwardly to allow electrical contact and testing of each test position 28 located at each of the plurality of test modules 12.

The process can include angularly and radially aligning a single electronic component 32 with contacts 14, 15 associated with each test position 28 for each of the plurality of test modules 12 to be tested. A value read for the single electronic component 32 can be recorded for each test position 28 located at each of the plurality of test modules 12. Each test position 28 can then be calibrated based on the recorded values read for the single electronic component 32.

The process can include indexing movement of the component-support member 26 with respect to the body 22 with opposing complementary interface surfaces 36, 38 located between the component-support member 26 and the body 22. At least one stop 44 can interact with one of a plurality of track index detents 40 located along the body 22 between the opposing interface surfaces 38, 36 of the body 22 and the component-support member 26. Each of the plurality of detents 40 can correspond to each radially spaced test position 28 for the electronic component 32. By way of example and not limitation, the process can include engaging at least one stop 44 associated with the component-support member 26 with at least one of the plurality of detents 40 located on surfaces of opposite sides 46, 48 of the slot 24 formed in the body 22 as illustrated in FIGS. 1-6C. Similarly, at least one stop 44a formed in the slot 24a of the body 22 can be engaged with at least one of the plurality of detents 40a located on facing surfaces of the component-support member 26a as shown in FIGS. 8 and 9. By way of example and not limitation, the process can include engaging at least one stop 44 associated with the component support member 26, such as disk 26b with at least one of the plurality of detents 40 located on the body 22 as illustrated in FIG. 11. The process can also include positioning a conformable material 50 in the pocket 30 for receiving the electronic component 32. The body 22 can be driven in rotation about the axis to different angular positions with a drive pin 52.

Figure 1:
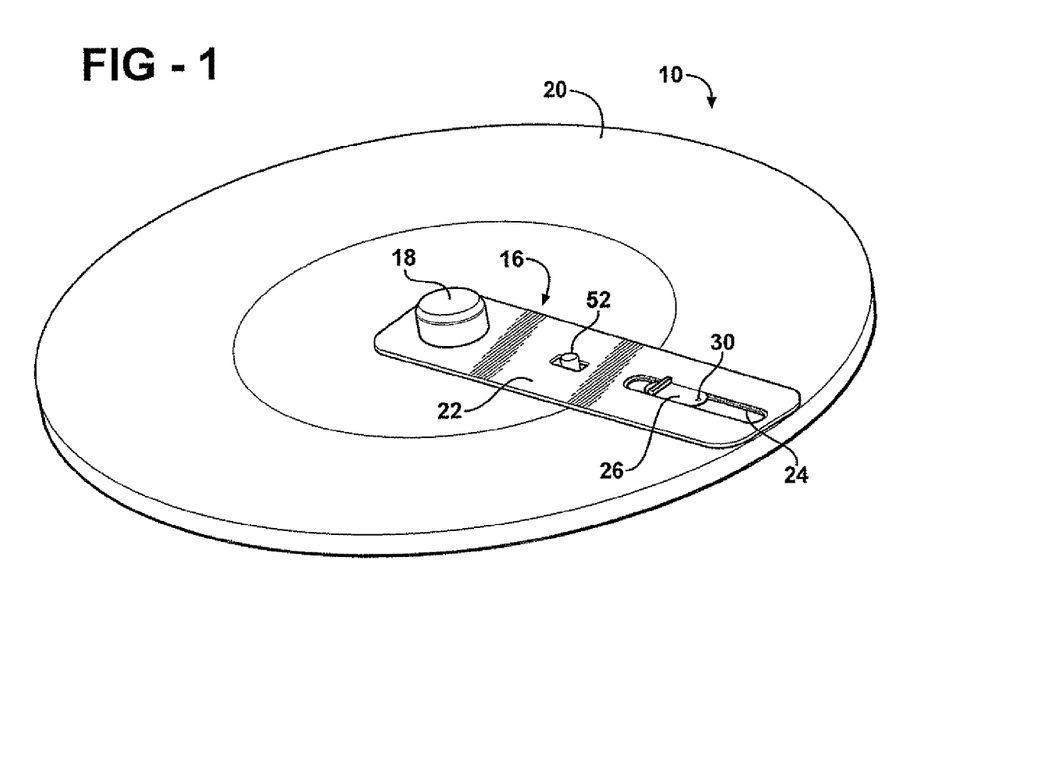
FIG. 1 is a perspective view of a body having an axis of rotation coaxially aligned with a central axis associated with the plurality of test modules for rotation about the axis of rotation to different angular positions, and a component-support member for indexing movement to selectively align with different contacts associated with each test position located at each of the plurality of test modules of an electronic testing machine.
Figure 2:
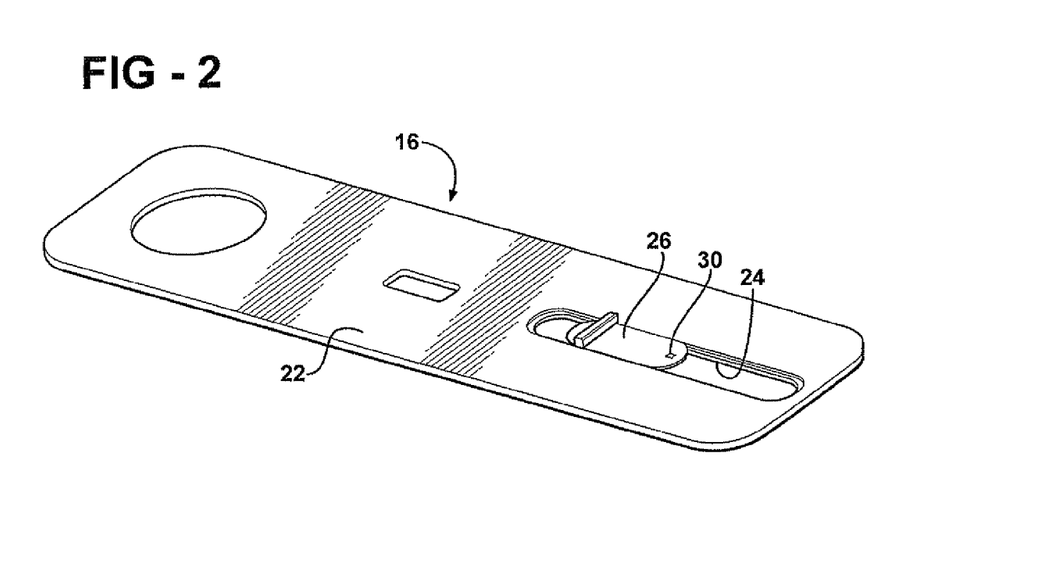
FIG. 2 is an enlarged detailed perspective view of the body and the component-support member of FIG. 1.
Figure 3:
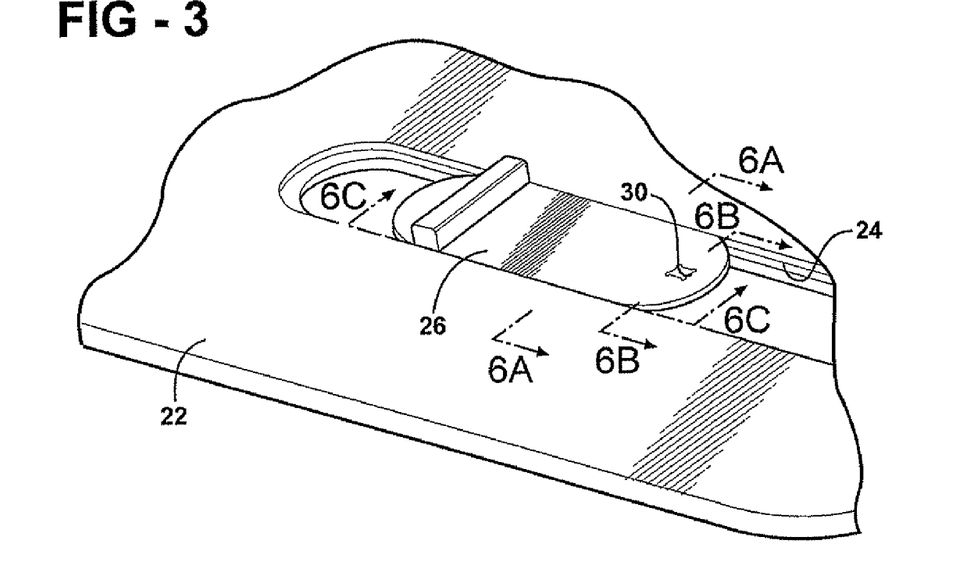
FIG. 3 is an enlarged detailed perspective view of the component-support member operably associated with the body of FIG. 1.
Figure 4A:
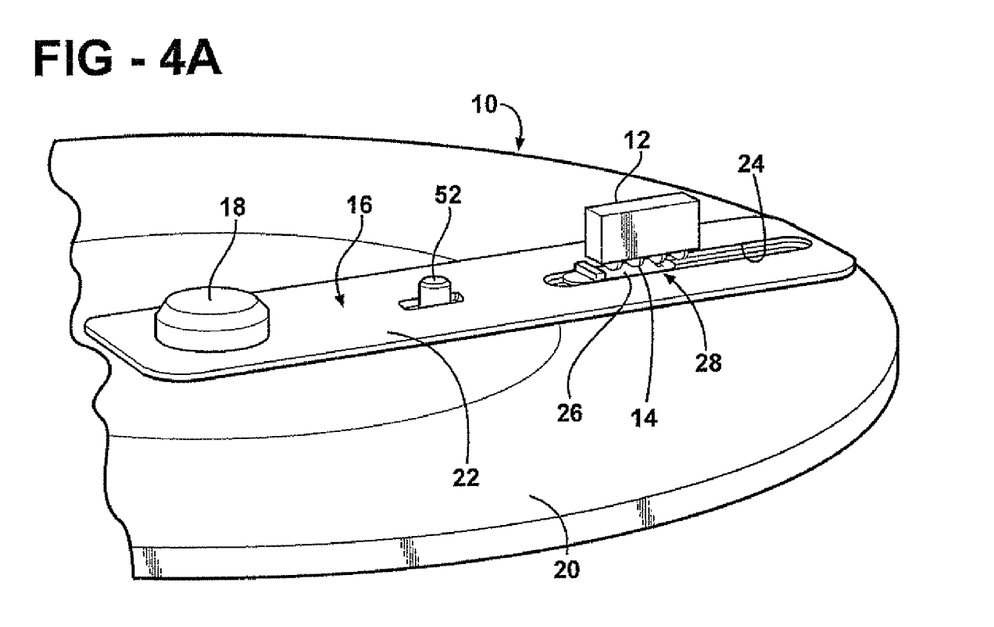
FIG. 4A is a partial perspective view of the body and the component-support member of FIG. 1 at a test position with respect to a test module of an electronic testing machine.
Figure 4B:
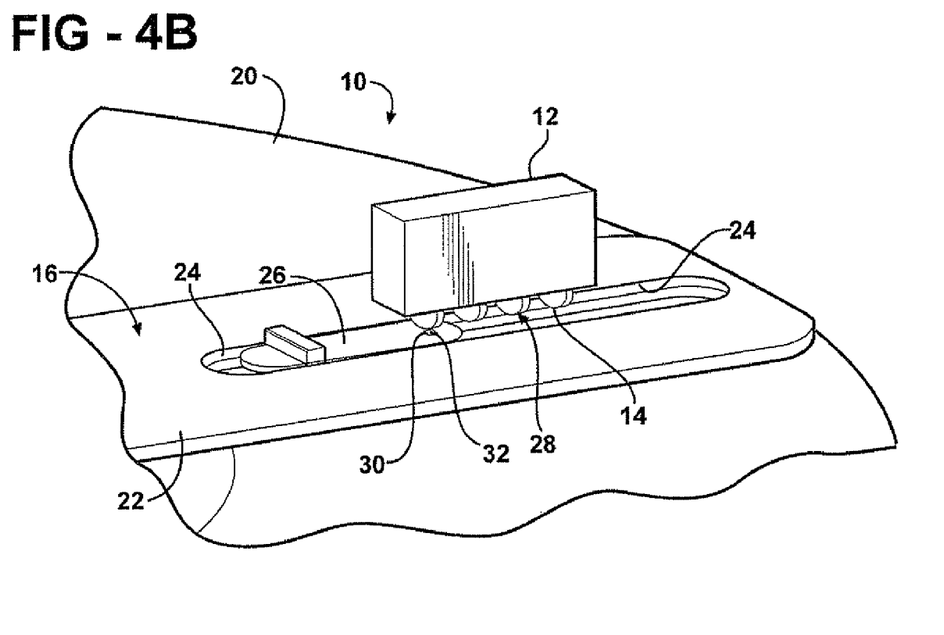
FIG. 4B is an enlarged detailed perspective view of the component-support member associated with the body of FIG. 1 and located at one of a plurality of radially and arcuately indexed test positions.

A calibration or compensation tool 16 can be made from a fiberglass, epoxy, or similar composition, in two or more pieces. The first piece or body 22 can fit over the center shaft 18 for the test plate 20, or can be coaxially aligned with the central axis in any suitable manner, and can be keyed to the drive pin 52 as illustrated in FIGS. 1 and 4A. This first piece 22 accepts the second piece or component support member 26 via machined slots 24 that are indexed to eight positions, allowing the second piece 26 to be moved to align with one of eight, or any number, of particular test positions 28. This second piece 26 can have a pocket 30 or carrier plate that would accept a MLCC of a particular size and hold that part securely with the terminated ends 34 directed outward to allow electrical contact and testing (FIGS. 6B, 6C). Other MLCC sizes can be accommodated with tooling material of the appropriate thickness for that particular part.

This tool 16 allows the testing of a single component such as a MLCC of a known value through multiple test stations with a minimal amount of mechanical damage or abrasion to the part and reduces the risk of losing the part or damaging the part during the procedure. This compensation tool 16 eliminates the need to run the component through the blowoff and recovery process, thereby reducing the amount of travel through the handling mechanism and reducing the chance of mechanical damage. With this tool 16, the component of known value is placed in the machine, moved only to the appropriate test station, tested, moved back to an open area, adjusted for the next position, moved into place, and the measurement repeated. This is repeated until the value of the component has been recorded for each test station.

This tool 16 allows for the testing and re-testing of a single component with a minimal impact on the physical condition of the component. The slide mechanism 26 reduces the required handling of the component and minimizes the risk of losing the tested part during test position change.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. In an electronic testing machine including a plurality of test modules located on angularly spaced radial lines extending from an associated central axis, each test module having a plurality of radially-spaced contacts defining test positions for testing electronic components, the improvement of a compensation tool for calibrating the plurality of test modules of the electronic testing machine to a standardized value comprising: a body having an axis of rotation coaxially alignable with the central axis associated with the plurality of test modules for rotation about the axis of rotation to different angular positions; and a movable component-support member attached to the body for indexing movement relative to the body to selectively align a pocket with different opposing contacts associated with each test position located at each of the plurality of test modules, the pocket extending from a top surface of the component-support member to an opposing bottom surface of the component-support member for receiving an electronic component with terminated ends extending outwardly to allow electrical contact and testing of each test position located at each the plurality of test modules.

2. The improvement of claim 1, wherein a single electronic component located within the pocket is alignable angularly and radially with contacts associated with each test position for each of the plurality of test modules to be tested by rotational movement of the body and indexing movement of the component-support member.

3. The improvement of claim 2, wherein a reading of a value for the single electronic component is recorded for each test position located at each of the plurality of test modules.

4. The improvement of claim 3, wherein each test position is calibrated based on the recorded value read for the single electronic component.

5. The improvement of claim 1 further comprising:
   the body and the component-support member defining opposing complementary interface surfaces allowing indexing movement of the component-support member relative to the body.

6. The improvement of claim 5 further comprising:
   a plurality of track index detents located between the opposing interface surfaces of the body and the component-support member, at least one stop interacting with at least one detent corresponding to each radially spaced test position for the electronic component.

7. The improvement of claim 6 further comprising:
   the plurality of detents located on opposite sides of a slot for engagement with at least one stop associated with the component-support member.

8. A compensation tool for calibrating each test position located at a plurality of test modules of an electronic testing machine to a standardized value, each test module located on angularly spaced radial lines extending from an associated central axis and having a plurality of contacts for testing electronic components, the compensation tool comprising: a body having an axis of rotation coaxially alignable with the central axis associated with the plurality of test modules for rotation about the axis of rotation to different angular positions; and a movable component-support member attached to the body for indexing movement relative to the body to selectively align a pocket with at least two different contacts associated with a respective test position of at least one of the plurality of test modules, the at least two different contacts spaced at different radial distances relative to the central axis and the pocket extending from a to surface of the component-support member to an opposing bottom surface of the component-support member for receiving an electronic component with terminated ends extending outwardly to allow electrical contact and testing of each respective test position.

9. The compensation tool of claim 8, wherein a single electronic component mounted within the pocket is alignable angularly by rotation of the body and radially by the indexing movement of the component-support member with contacts associated with each test position for each of the plurality of test modules to be tested.

10. The compensation tool of claim 9, wherein a reading of a value for the single electronic component is recorded for each test position located at each of the plurality of test modules.

11. The compensation tool of claim 10, wherein each test position is calibrated based on the recorded value read for the single electronic component.

12. The compensation tool of claim 8 further comprising:
the body and the component-support member defining opposing complementary interface surfaces allowing indexing movement of the component-support member relative to the body.

13. The compensation tool of claim 12 further comprising:
a plurality of track index detents located along a slot between the opposing interface surfaces of the body and the component-support member, at least one stop interacting with at least one detent corresponding to each radially spaced test position for the electronic component.

14. The compensation tool of claim 13 further comprising:
the plurality of detents located on opposite sides of the slot for engagement with at least one stop associated with the component-support member.

15. A method for calibrating a plurality of test modules in an electronic testing machine to a standardized value with a compensation tool, each test module located on angularly spaced radial lines extending from an associated central axis and having a plurality of contacts for testing electronic components comprising:
coaxially aligning a body having an axis of rotation with the central axis associated with the plurality of test modules for rotation about the axis of rotation to different angular positions; and
indexing a component-support member with respect to the body to selectively align a pocket of the component-support member with at least two different contacts associated with a respective test position of at least one of the plurality of test modules, the at least two different contacts spaced at different radial distances relative to the central axis, the component-support member mounted to the body for movement therewith and the pocket extending from a top surface of the component-support member to an opposing bottom surface of the component-support member for receiving an electronic component with terminated ends extending outwardly to allow electrical contact and testing of each respective test position.

16. The method of claim 15 further comprising:
angularly and radially aligning a single electronic component with contacts associated with each test position for each of a plurality of test modules to be tested while maintaining the single electronic component in the pocket, at least certain of the contacts located on the angularly spaced radial lines.

17. The method of claim 16 further comprising:
recording a reading of a value for the single electronic component for each test position located at each of the plurality of test modules to be tested.

18. The method of claim 17 further comprising:
calibrating each test position based on the recorded value read for the single electronic component.

19. The method of claim 15 further comprising:
indexing movement of the component-support member with respect to the body with opposing complementary interface surfaces located between the component-support member and the body.

20. The method of claim 19 further comprising:
interacting at least one stop with one of a plurality of track index detents located between the opposing interface surfaces of the body and the component-support member, at least one detent corresponding to each radially spaced test position for the electronic component.

* * * * *